United States Patent [19]

Schleifer

[11] Patent Number: 6,035,002
[45] Date of Patent: Mar. 7, 2000

[54] DIGITAL SUPER-REGENERATIVE DETECTOR RF RECEIVER

[75] Inventor: Fred Freybler Schleifer, Appleton, Wis.

[73] Assignee: The Chamberlain Group, Inc., Elmhurst, Ill.

[21] Appl. No.: 08/956,501

[22] Filed: Oct. 22, 1997

Related U.S. Application Data

[63] Continuation-in-part of application No. 08/882,662, Jun. 25, 1997, abandoned, which is a continuation of application No. 08/461,425, Jun. 5, 1995, abandoned.

[51] Int. Cl.[7] .............................. H04L 25/06; H04L 25/10
[52] U.S. Cl. ......................... 375/318; 329/324; 329/343; 455/182.1; 455/192.1; 455/255; 318/264; 49/28
[58] Field of Search ..................................... 375/271, 316, 375/318, 322, 324, 328, 344; 329/315, 324, 341, 343, 344; 340/825.72; 455/182.1, 182.2, 192.1, 192.2, 226.1, 255, 257, 265; 318/264, 265, 266; 49/28

[56] References Cited

U.S. PATENT DOCUMENTS

| | | | |
|---|---|---|---|
| 3,716,865 | 2/1973 | Willmott | 343/225 |
| 3,906,348 | 9/1975 | Willmott | 325/37 |
| 4,037,201 | 7/1977 | Wilmott | 340/167 |
| 4,066,964 | 1/1978 | Costanza et al. | 375/260 |
| 4,159,448 | 6/1979 | Parham | 329/313 |
| 4,529,980 | 7/1985 | Liotine | 340/825.52 |
| 4,535,333 | 8/1985 | Twardowski | 340/825.69 |
| 4,638,433 | 1/1987 | Schindler | 364/400 |
| 4,995,053 | 2/1991 | Sinpson et al. | 375/200 |

OTHER PUBLICATIONS

Whitehead, J.R., "Super–Regenerative Receivers," Cambridge at the University Press, 1950.

*Primary Examiner*—Don N. Vo
*Attorney, Agent, or Firm*—Fitch, Even, Tabin & Flannery

[57] ABSTRACT

A digital super-regenerative receiver is provided having an analog RF detector and a regenerative oscillator. The output of the RF detector is used to generate a digital signal from which the oscillator bias is adjusted, in order to maintain the oscillator start-up time at a fixed level. The circuit senses if the start-up time is earlier or later than the predetermined start-up time and produces an output when the majority of the start times are ahead of the expected start time.

2 Claims, 9 Drawing Sheets

DIGITAL SUPER-REGENERATIVE DETECTOR RF RECEIVER

This application is a continuation of application Ser. No. 08/882,662 filed Jun. 25, 1997 now abandoned which is a continuation of application Ser. No. 08/461,425 filed Jun. 5, 1995 now abandoned.

BACKGROUND OF THE INVENTION

The invention relates in general to a receiver for security systems which allow operation upon the receipt of a properly coded signal. More particularly, the invention relates to a digital super-regenerative receiver for a security system or to a barrier operator system, such as a garage door operator, employing a transmitter and a receiver.

It is well-known to provide radio-controlled garage door operators which include a garage door operator unit having a radio receiver and a motor connected to be driven from the radio receiver. The radio receiver is adapted to receive radio frequency signals or other electromagnetic signals having particular signal characteristics which, when received, cause the door to be opened. More recently, such transmitter and receiver systems have become relatively more sophisticated in that they use radio transmitters which employ coded transmissions of multiple or three-valued digits, also known as "trinary bits" or other serial coded transmission techniques. Once such signals are received, a microcontroller is generally used to decode the trinary word.

Analog super-regenerative receivers have been known for use in such systems. Super-regeneration is a form of regenerative amplification. In a regenerative receiver, a detector is provided having positive or regenerative feedback from the output to the input. The feedback must maintain operation on the verge of oscillation. In a super-regenerative detector, the circuit is switched into and out of oscillation by an oscillator operating at a very low frequency rate, called the "quench" frequency. That is, the oscillator allows oscillations to build up in the regenerative circuit and then causes them to die out. In the absence of an incoming signal, oscillations are initiated by thermal noise, build up to a critical amplitude and die out. An incoming signal larger than the thermal noise advances the build up time. Thus, the peak is reached sooner, and the oscillations die out sooner. The frequency of interruption increases with signal strength. A detector will provide indication of the incoming signal based on the advance of the build up period.

Super-regenerative receivers provide greater sensitivity than other types of receivers. However, most analog super-regenerative receivers require a large number of analog components that are not easily integrated or incorporated into an application-specific integrated circuit (ASIC). As such, manufacturing costs are relatively high. In addition, such super-regenerative receivers require relatively high current to operate. Thus, they consume more power and decrease battery life. In addition, such super-regenerative receivers do not generally decode the trinary word themselves. Rather, a separate microcontroller is used, which must be kept constantly on. Even if the microcontroller is maintained at a lower-running clock speed, it will still draw current and hence decrease battery life. Also, many super-regenerative receivers require an audio amplifier, thereby increasing system complexity, cost and power consumption. Finally, many super-regenerative receivers are sensitive to variations in transistor characteristics.

Accordingly, there is a need for a relatively simple super-regenerative receiver that requires relatively low current and hence draws less power than previous receivers. There is a further need for a super-regenerative receiver that tracks the received signal more quickly than other receivers.

SUMMARY OF THE INVENTION

Accordingly, it is an object of the invention to provide a super-regenerative receiver that tracks more quickly than other receivers and that draws less power than other receivers It is a further object of the present invention to provide a super-regenerative receiver that obviates the need for a microprocessor for signal decoding.

It is a still further object of the present invention to provide a super-regenerative receiver that is relatively insensitive to transistor characteristics.

It is a still further object of the present invention to provide a super-regenerative receiver that does not require an audio amplifier.

In accordance with one embodiment of the invention, a digital super-regenerative receiver is provided having an analog RF detector and a regenerative oscillator. The output of the RF detector is used to generate a digital signal from which the oscillator bias is adjusted, in order to maintain the oscillator start-up time at a fixed level. The circuit senses if the start-up time is earlier or later than the predetermined start-up time and produces an output signal when the majority of the start times are ahead of the expected start time.

DETAILED DESCRIPTION OF THE PREFERRED EMBODIMENT

Figure 1:
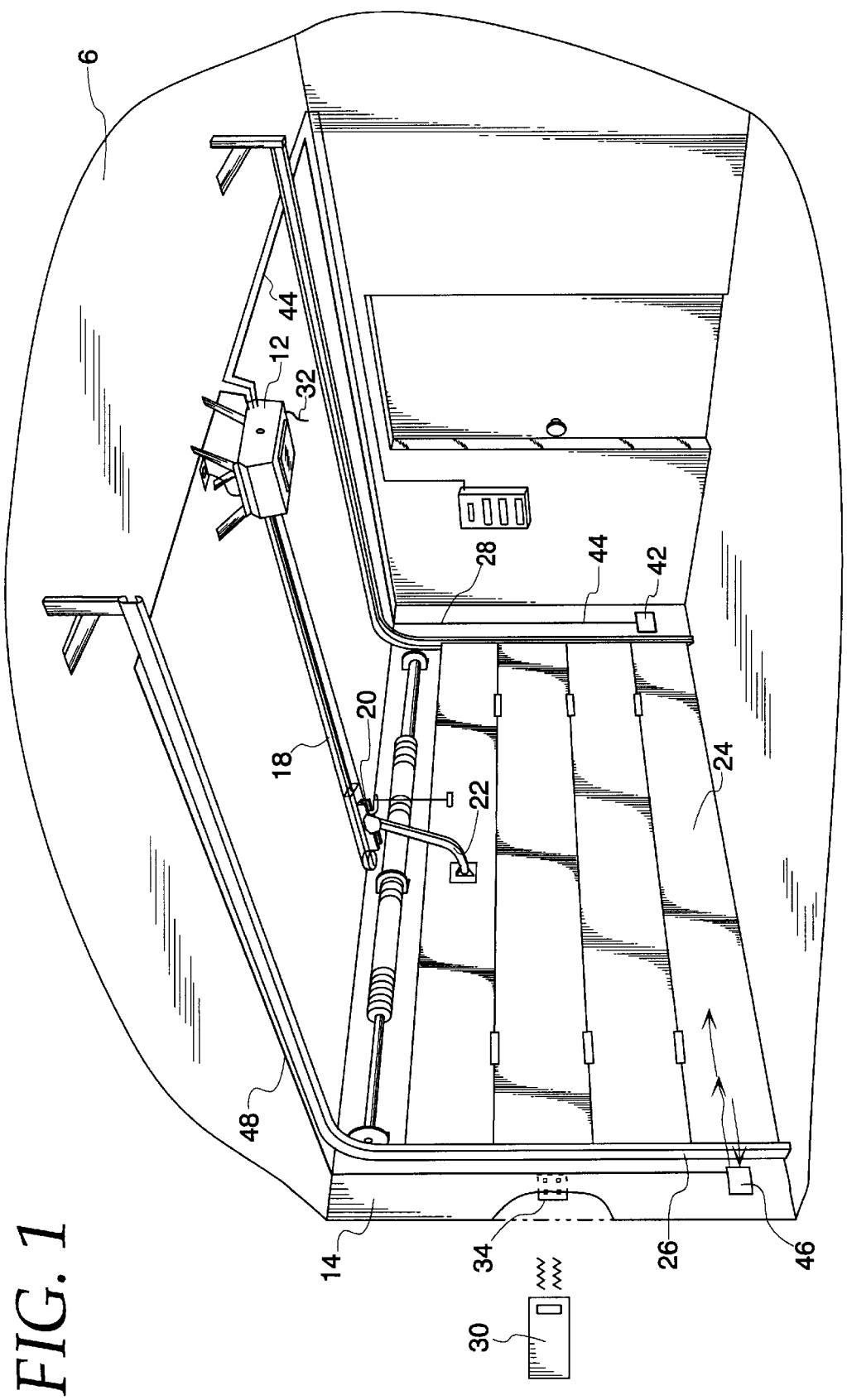
FIG. 1 is a perspective view of an apparatus for moving a barrier or garage door embodying the present invention.

Referring now to the drawings and especially to FIG. 1, more specifically a movable barrier door operator or garage door operator is generally shown therein and includes a head unit 12 mounted within a garage 14. More specifically, the head unit 12 is mounted to the ceiling 6 of the garage 14 and includes a rail 18 extending therefrom with a releasable trolley 20 attached having an arm 22 extending to a multiple paneled garage door 24 positioned for movement along a pair of door rails 26 and 28. The system includes a hand-held transmitter unit 30 adapted to send signals to an antenna 32 positioned on the head unit 12 and coupled to a receiver as will appear hereinafter. An external control pad 34 is positioned on the outside of the garage having a plurality of buttons thereon and communicate via radio frequency transmission with the antenna 32 of the head unit 12. An optical emitter 42 is connected via a power and signal line 44 to the head unit. An optical detector 46 is connected via a wire 48 to the head unit 12.

Figure 2:
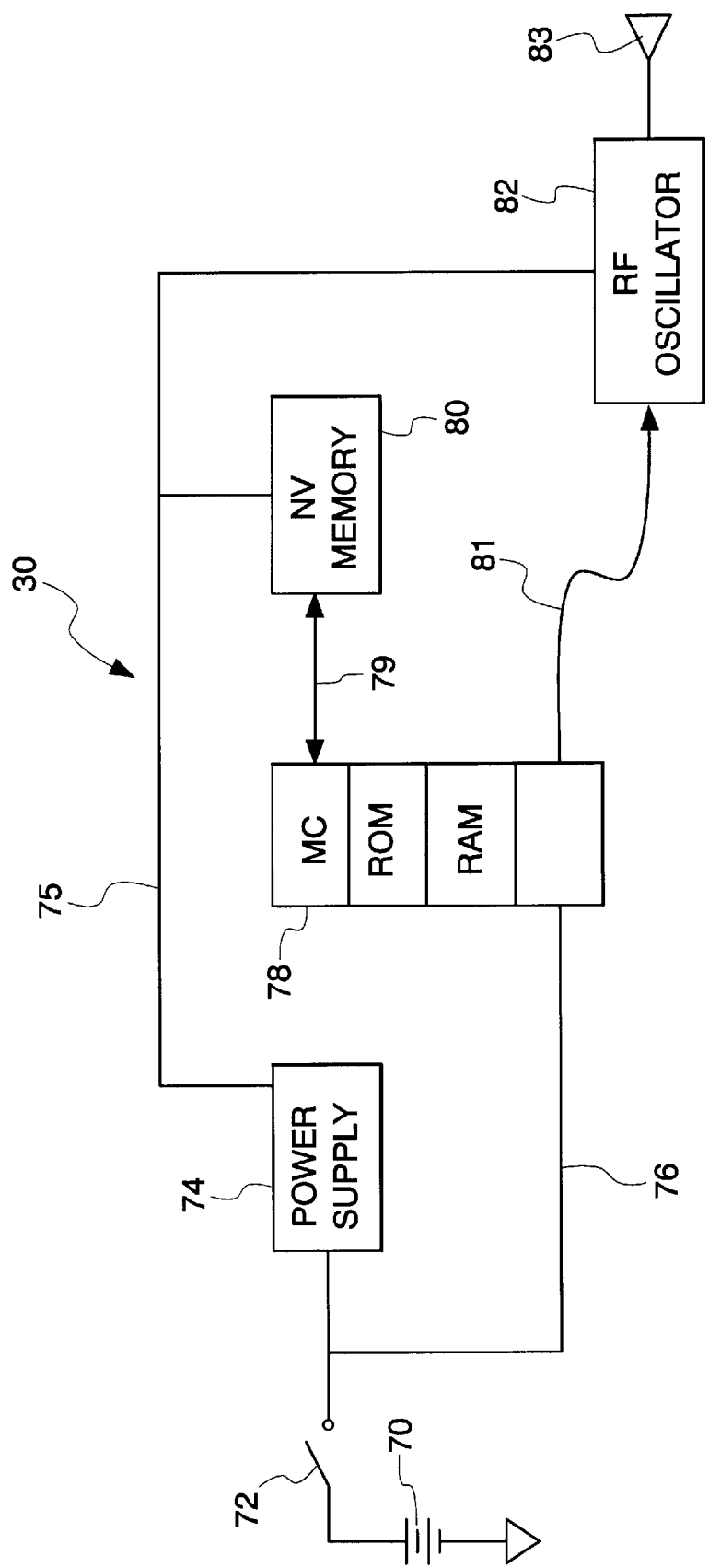
FIG. 2 is a block diagram of a transmitter for use with a garage door operator of FIG. 1.

Referring now to FIG. 2, the transmitter 30 is shown therein in general and includes a battery 70 connected by a pushbutton switch 72 to a power supply 74 which is coupled via leads 75 and 76 to a microcontroller 78. The microcontroller 78 is connected by a serial bus 79 to a non-volatile memory 80. An output bus 81 connects the microcontroller to a radio frequency oscillator 82. The microcontroller 78 produces coded signals when the button 72 is pushed causing the output of the RF oscillator 82 to be amplitude modulated to supply a radio frequency signal at an antenna 83 connected thereto.

Figure 3:
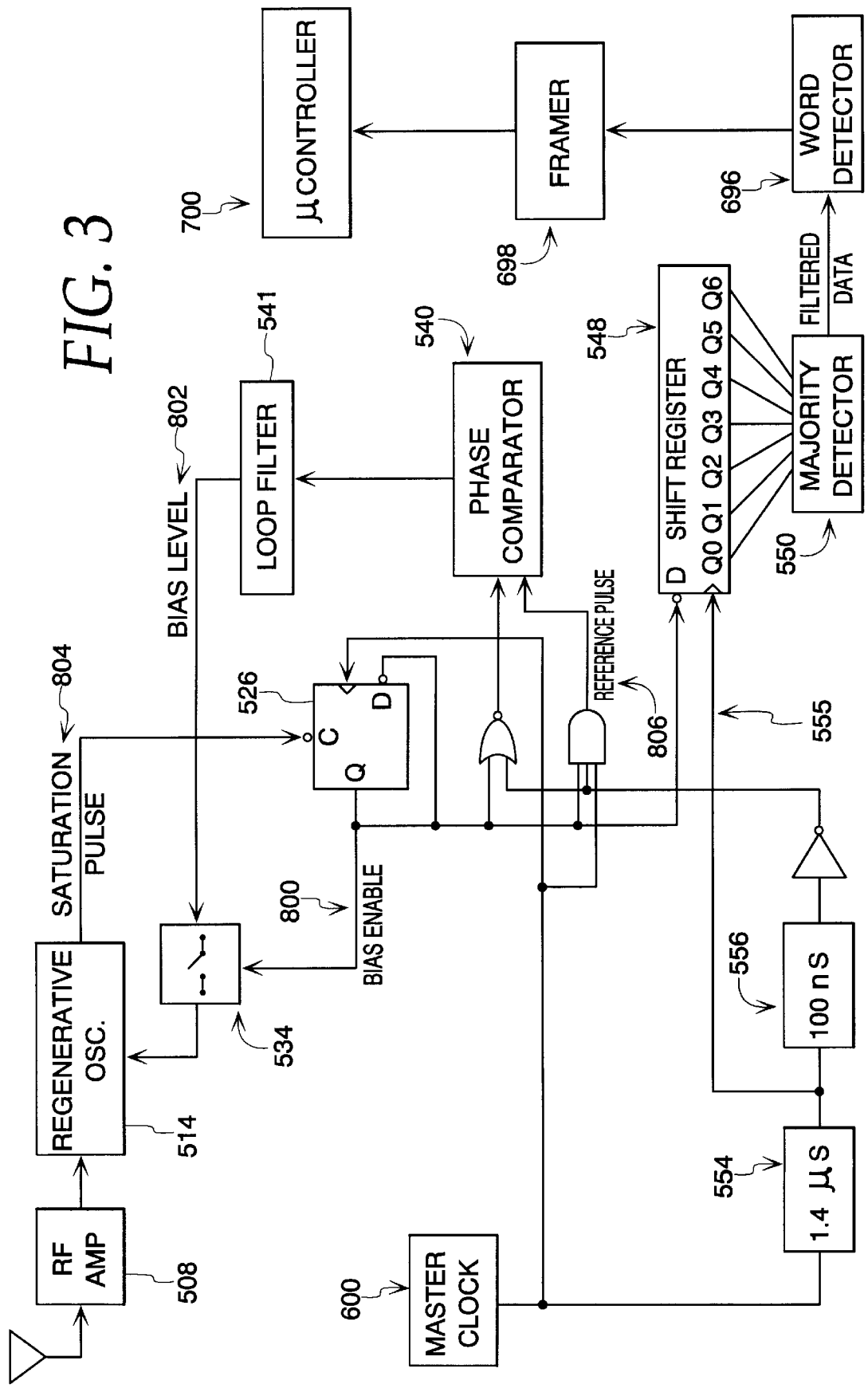
FIG. 3 is a block diagram of a receiver positioned within a head unit of the garage door operator shown in FIG. 1.

A block diagram of the receiver is shown in FIG. 3. A master clock 600 enables the bias to RF amplifier 508 and regenerative oscillator 514. When the regenerative oscillator builds to saturation, it terminates via line 804 the bias enable signal 800. The start up time of the oscillator is shorter when there is a signal present than it is in the presence of noise. A phase comparator 540 monitors the start up time of the oscillator and adjusts the gain of the oscillator via oscillator bias level signal 802 such that the nominal start up time is equal to the reference pulse 806. If the start up time is shorter than nominal it cuts back the bias. If it is longer, it increases the bias. The phase comparator detects whether the oscillator is starting sooner or later than the nominal start up time and feeds this information to the loop filter 541 and the majority detector 550. The shift register 548 normally clocks in logical zeroes since its clock signal 555 precedes bias enable 800 by 100 nanoseconds. During reception of the carrier signal, the oscillator starts more quickly. Thus, shift register 548 clocks in logical ones when there is a carrier present instead of logical zeroes. The response of the loop filter 541 is slow enough so that it does not lengthen the oscillator start up time during the bit period. The three-of-five majority detector 550 acts as a low pass filter and provides a clean output waveform with up to two corrupted input data samples. This output is the recovered digital signal. A word detector 696 monitors the rising and falling edges of the majority detector output. If it detects valid trinary word timing, it wakes the microcontroller 700 for complete code recognition. Optionally, a framer 698 may be included that reads one to two entire frames before waking the microcontroller.

Figure 4A:
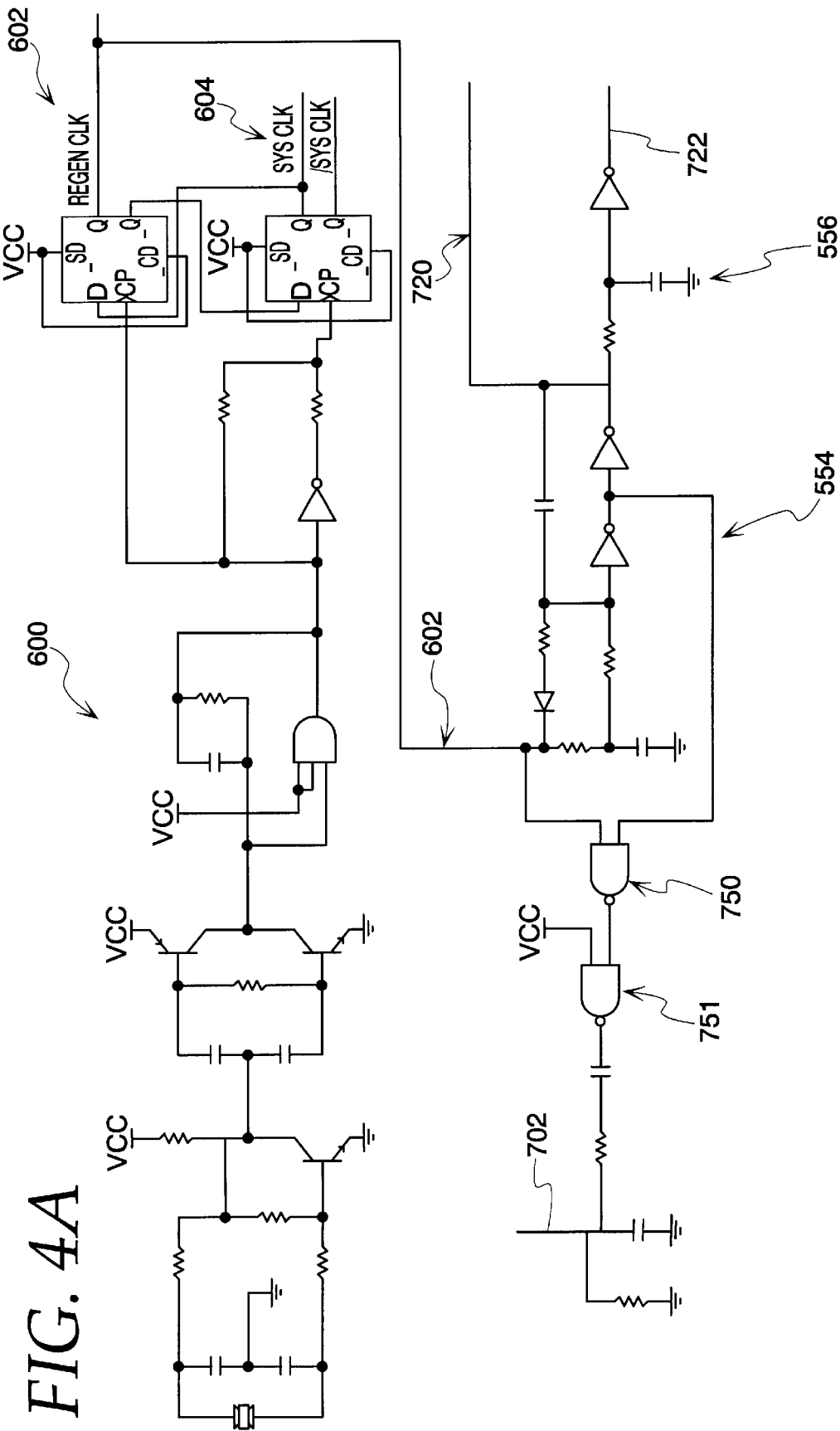
FIG. 4A is a schematic diagram of the clock generator and delays of the receiver shown in FIG. 3.
Figure 4B:
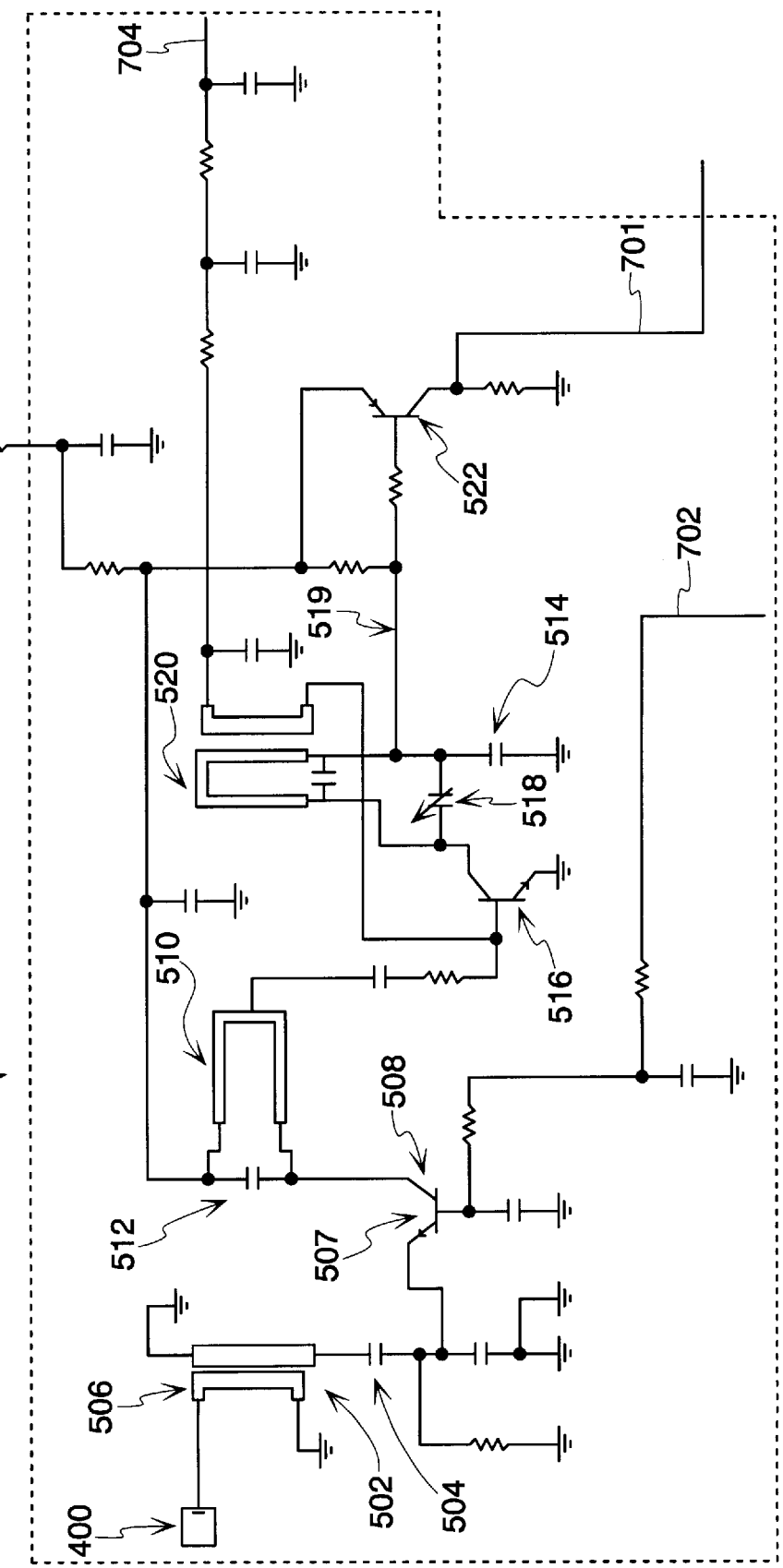
FIG. 4B is a schematic of the RF detector for the receiver shown in FIG. 3.

A schematic of the receiver described above is shown in FIGS. 4A–F. A clock generator 600 (FIG. 4A) generates a regenerative clock signal 602 and a system clock signal 604. Regenerative clock signal 602 is also coupled to a 1.4 microsecond delay 554 for producing an offset 720 to clock signal 602 and a 100 nanosecond delay 556 for producing a second offset signal 722 to clock signal 602 (FIG. 4A). Delay 554 corresponds to a predetermined nominal reference start up time of the oscillator. The oscillator start up time will be shorter than the nominal time if a carrier signal is present. If only a noise signal is present, the oscillator start up time will be longer than the nominal start up time.

Delay 556 on the other hand, represents a permitted signal level above noise which still permits the majority detector to filter out false logical-ones. Jitter of the oscillator start up time due to band limited white noise may cause an unacceptable number of false logical-one bit detections. In particular, delay 556 represents a threshold level of one false logical-ones per ten samples. The three-of-five majority detector is able to filter this level of error. It should be noted that the reference delay and the error delay are exemplary only and that use of other such parameters is within the scope of the present invention.

Figure 4C:
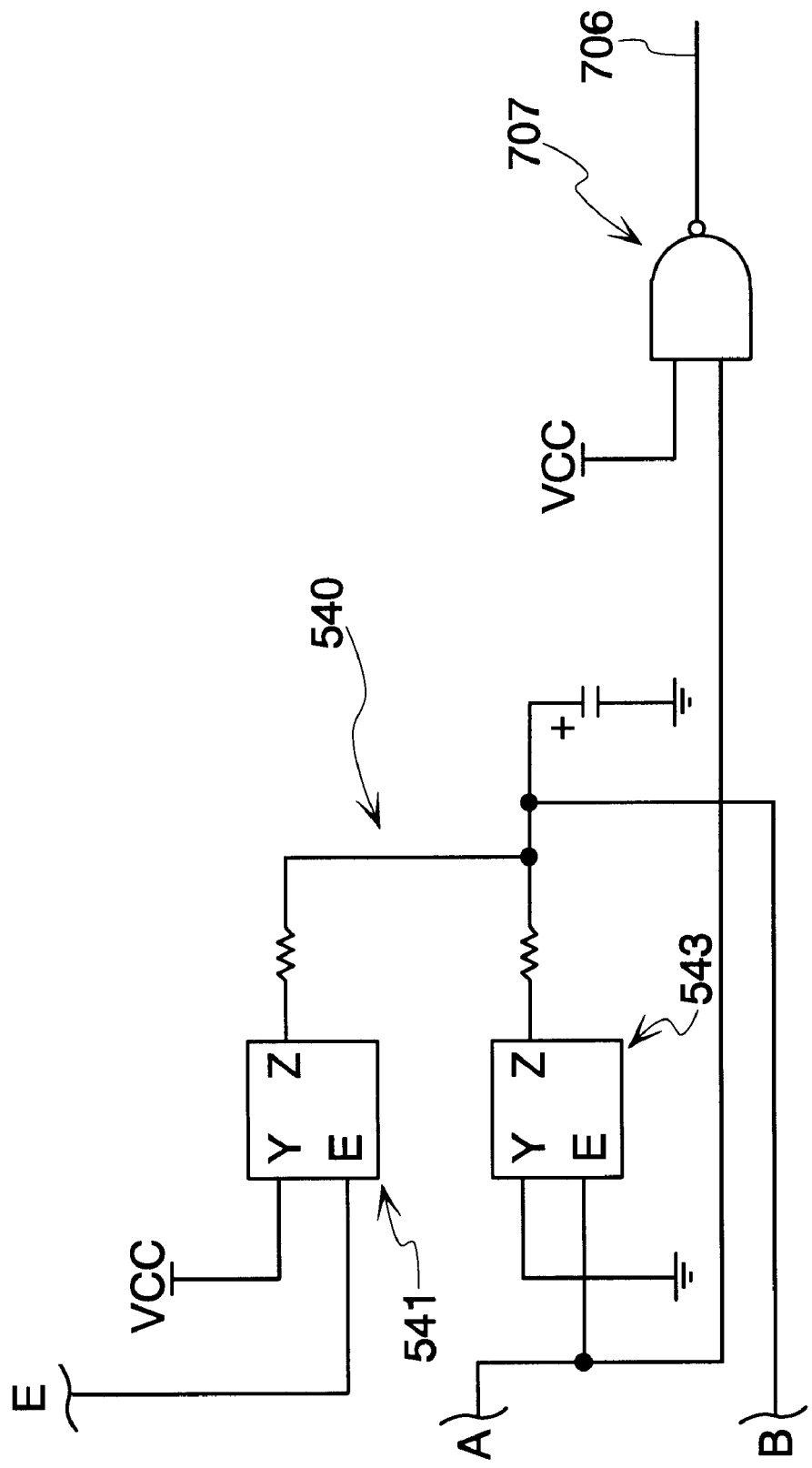
FIG. 4C is a schematic of the phase comparator, of the receiver shown in FIG. 3.
Figure 4D:
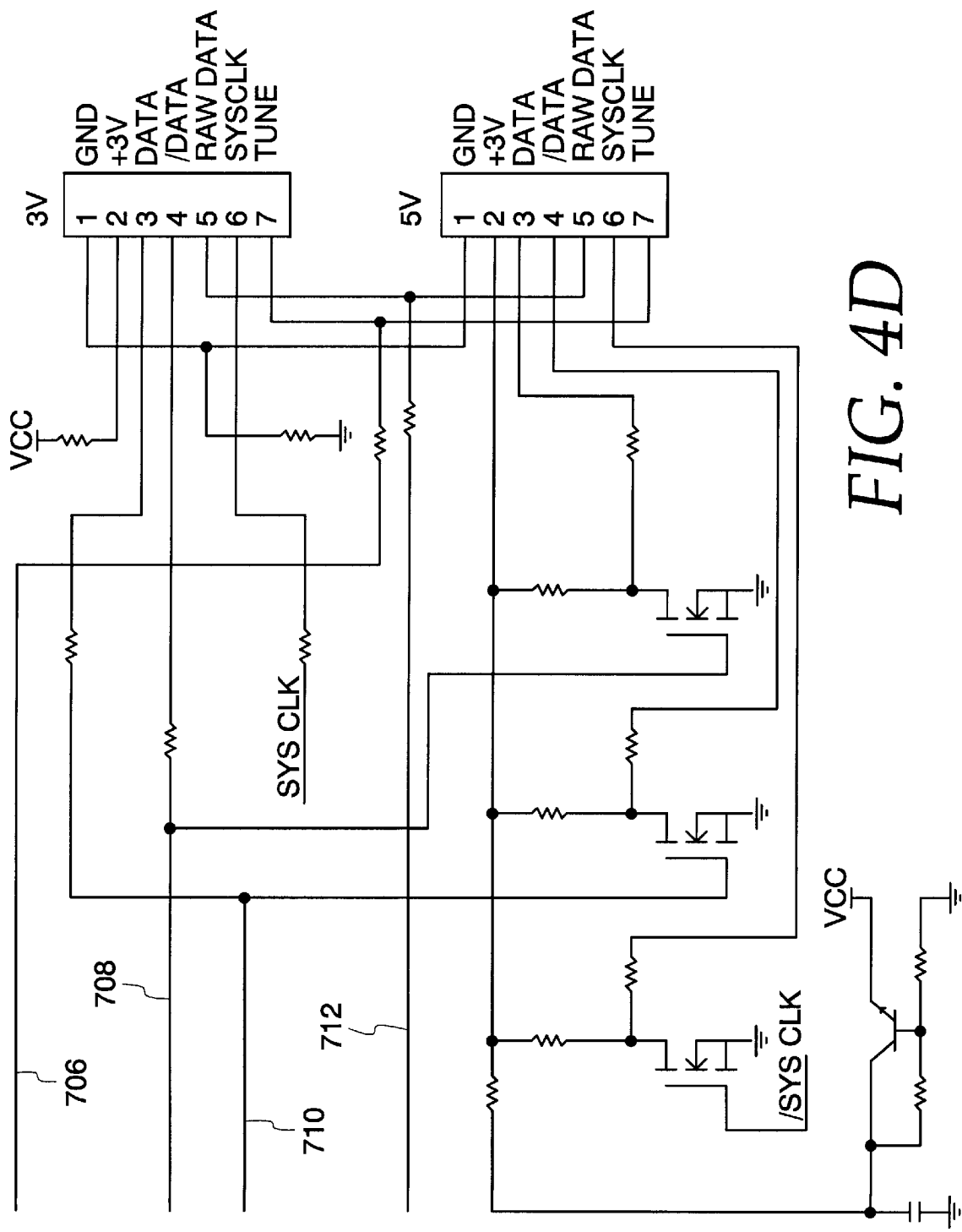
FIG. 4D is a schematic of the 3V and 5V interfaces of the receiver shown in FIG. 3.
Figure 4E:
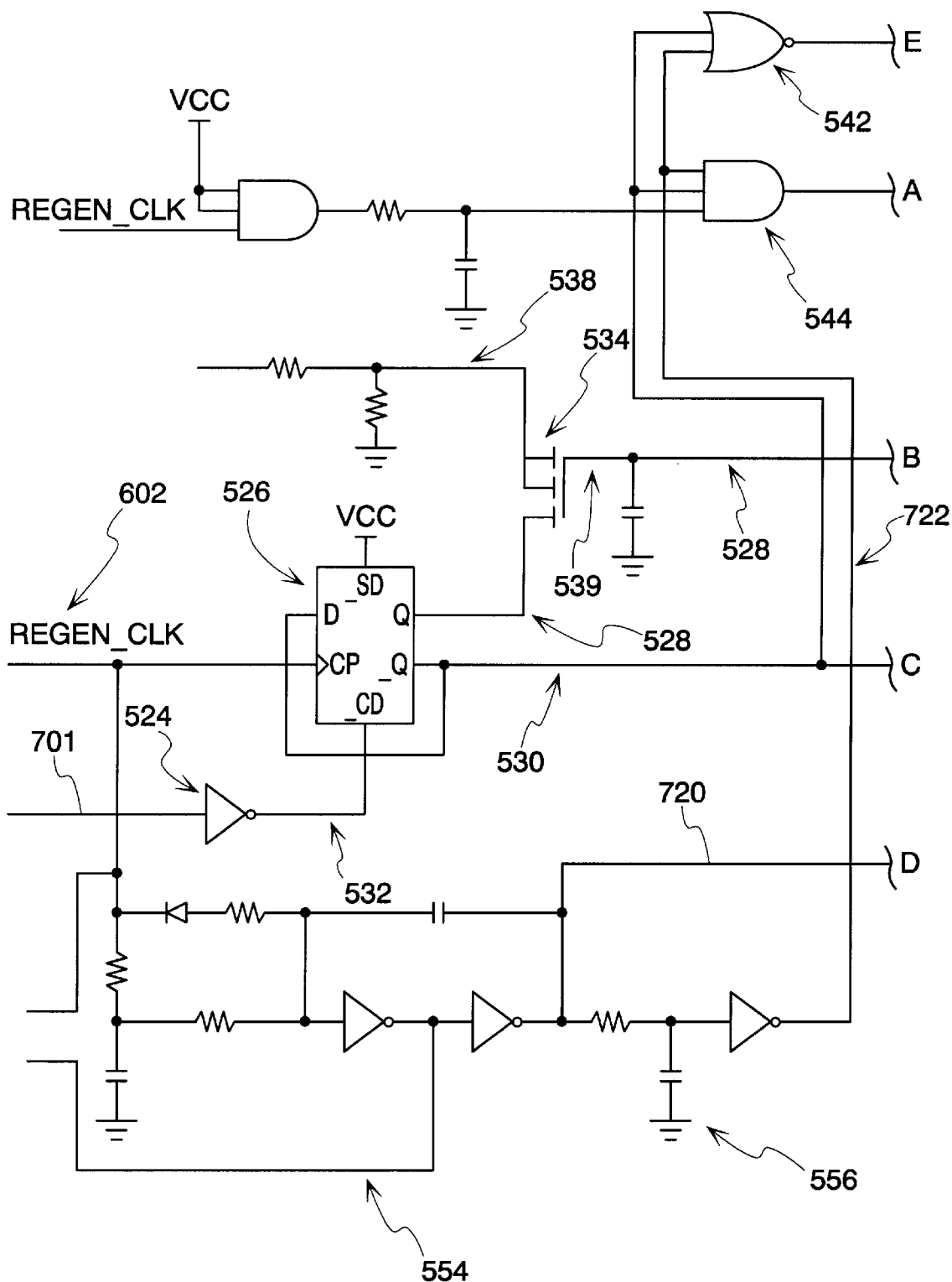
FIG. 4E is a schematic of the oscillator bias of the receiver shown in FIG. 3.
Figure 4F:
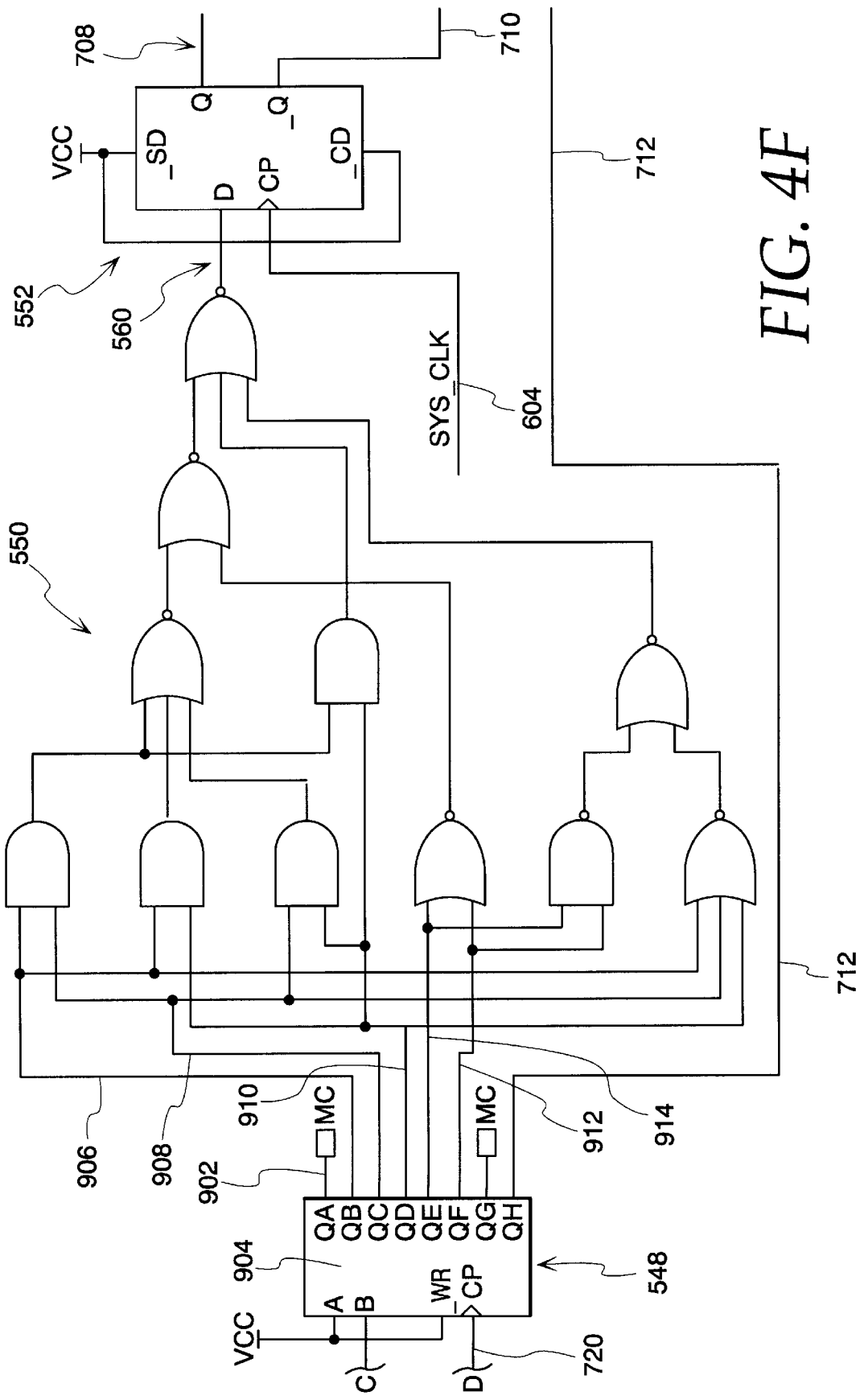
FIG. 4F is a schematic of the majority detector of the receiver shown in FIG. 3.

The RF detector 500 generates a digital signal along lead 701 responsive to the input digitally coded radio frequency signal. The input 400 of the RF detector 500 (FIG. 4B) is coupled to a network 502 comprised of an inductance 506 and a capacitor 504 which supply the digitally coded RF signal to an analog amplifier 507 having an NPN transistor 508 at its emitter. The buffer amplifier 507 provides a buffered radio frequency output signal to a reactive network comprising an inductance 510 and capacitor 512. NPN transistor 508 is coupled at its base to clock 602 and delay 554 via NAND gates 750 and 751 through lead 702. The buffer amplifier also isolates the antenna from the noise from the super-regenerative receiver. The base of NPN transistor 508 is pulsed by the clock, turning the transistor on and off in order to save power. These form part of the super-regenerative receiver also having an inductance 520 coupled to analog oscillator 516. The amount of feedback is adjusted using variable capacitance 518. Capacitance 518 and inductance 520 form a tuned circuit tuned to the carrier frequency. Current level detector 522 receives the analog oscillator signal 519. The output of 522 is a digital signal on lead 701. The digital signal generator 522 generates pulses which, after being inverted by inverter 524, are delivered to the CLEAR lead 532 of D flip-flop 526 (FIG. 4E). The regenerative clock signal 602 clocks the D flip flop 526, which holds the digital input stable for the sampling period.

The Q output 528, the bias enable signal, of D flip flop 526 is connected to the source 529 of field effect transistor (FET) 534. FET 534 acts as a switch to control the bias level of regenerative oscillator 514 via lead 704. The not Q output 530 of D flip flop 526 is connected to the B input of shift register 548 (FIG. 4I). Shift register 548 is clocked by the regenerative clock 602, after a 1.4 microsecond delay offset 554. Offset 554 provides a nominal reference signal from which the incoming signal is detected. The not Q output 530 of D flip flop 526 is also connected to one input of NOR gate 542. The other input 722 of NOR gate 542 is connected to regenerative clock 602, but only after delay 554 and additional 100 nanosecond delay offset 556. Delay 556 is chosen based on the desired error characteristics of the receiver system. The output of NOR gate 542 and the output of AND gate 544 are fed into quad switches 541 and 543, respectively, of phase comparator 540 (FIG. 4C). AND gate 544 has as its inputs the regenerative clock 602 as well as the not Q output of D flip flop 526 and the delayed regenerative clock at the output of delay 556. Thus, phase comparator 540 compares a delayed clock signal (that is a combination of the offset clock signal resulting from both delay offset 554 and delay offset 556), with the digital signal output from digital signal generator 522, held by D flip flop 526.

In a preferred embodiment, phase comparator 540 includes a pair of 74HC4016 quad switches 541 and 543. The output of phase comparator 540 is connected via lead 538 to the gate 539 of FET 534. Phase comparator 540 detects whether the oscillator is starting sooner or later than the nominal start up time. If it is starting sooner, the output of the phase comparator 540—the bias level signal—will go negative and cause FET 534 to decrease the bias to regenerative oscillator 514 along leads 536 and 704. If the oscillator is starting later than the nominal start up time, the output of phase comparator will go high, causing the bias of oscillator 514 to decrease. That is, a combination clocked and analog bias signal is delivered to the oscillator to stabilize the oscillator timing. The output of AND gate 544 is also coupled to NAND gate 707, the output of which is delivered to the 3 volt and 5 volt interfaces (FIG. 4D) and used for tuning. The digital signal along lead 530, connected to the not Q output of D flip flop 526 is connected to the input of shift register 548. In a preferred embodiment, shift register 548 is an 8 output 74HC164. Shift register 548 normally clocks in logical zeroes, since its clock signal precedes the falling edge of bias enable by 100 ns, the error correction delay 556. However, when a carrier is present, the oscillator 514 starts more quickly and the shift register will clock in logical ones. Thus, the shift register 548 compares the offset delay clock signal 720 with the digital signal and generates a detected code. The outputs of shift register 548 are fed into majority detector 550. The first 902 and seventh 904 outputs are not connected. The last output 712 is provided as raw data to the 3V and 5V interfaces (FIG. 4D). Majority pulse detector 550 receives the coded signals from shift register 548 and produces an accepted code signal as output when the majority of the outputs 906, 908, 910, 912 and 914 of shift register 548 are high. That is, a positive output will result when the majority of oscillator start times is ahead of the nominal start time and thus, a carrier is present.

Output 560 of majority detector 550 is input into D flip flop 552, which is clocked by system clock 604. Outputs 708 and 710 of D flip flop 552 are the data that is fed to the rest of the system, including the microcontroller via the 3 volt and 5 volt interfaces (FIG. 4D).

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed is:

1. A receiver for receiving a digitally coded radio-frequency signal from a transmitter, comprising:

an RF detector for detecting the digitally coded radio-frequency signal and for generating a digital signal responsive to the digitally coded radio-frequency signal, the RF detector comprising an analog amplifier coupled to an analog oscillator for generating an analog oscillator signal and a digital signal generator responsive to the analog oscillator signal for producing the digital signal;

a clock signal generator for producing a clock signal;

a delayed clock signal generator for generating a first offset clock signal and a second offset clock signal in response to the clock signal; and a first comparator for comparing the second offset clock signal with the digital signal and producing a combination clocked and analog bias signal and supplying the combination clocked and analog bias signal to the oscillator to stabilize the oscillator timing;

a second comparator for comparing the first offset signal with the digital signal and generating a detected code signal in response thereto.

2. A receiver according to claim 1, further comprising a majority pulse detector coupled to receive the detected code signal and for producing an accepted code signal in response to receipt of a predetermined number of code signals.

\* \* \* \* \*